US012672249B2

(12) United States Patent
Crosbie et al.

(10) Patent No.:  US 12,672,249 B2
(45) Date of Patent:  Jun. 30, 2026

(54) THERMALLY INSULATING AND ELECTRICALLY CONDUCTIVE SPACER

(71) Applicant: Google LLC, Mountain View, CA (US)

(72) Inventors: Paul B. Crosbie, Chicago, IL (US);
Garrick Chow, Foster City, CA (US);
Michelle Yu, Redwood City, CA (US);
James A. Cooper, Sunnyvale, CA (US)

(73) Assignee: Google LLC, Mountain View, CA (US)

( * ) Notice: Subject to any disclaimer, the term of this patent is extended or adjusted under 35 U.S.C. 154(b) by 171 days.

(21) Appl. No.: 18/701,889

(22) PCT Filed: Dec. 27, 2021

(86) PCT No.: PCT/US2021/073116
§ 371 (c)(1),
(2) Date: Apr. 16, 2024

(87) PCT Pub. No.: WO2023/129172
PCT Pub. Date: Jul. 6, 2023

(65) Prior Publication Data
US 2024/0414868 A1    Dec. 12, 2024

(51) Int. Cl.
*H05K 7/14*      (2006.01)
*H05K 7/20*      (2006.01)
*H05K 9/00*      (2006.01)

(52) U.S. Cl.
CPC .......... *H05K 7/142* (2013.01); *H05K 9/0039* (2013.01); *H05K 7/20445* (2013.01)

(58) Field of Classification Search
CPC .. H05K 7/142; H05K 7/20445; H05K 9/0039;
H05K 1/115; H05K 1/181; H05K 1/0215;
H05K 1/144
See application file for complete search history.

(56) References Cited

U.S. PATENT DOCUMENTS

| | | | | |
|---|---|---|---|---|
| 4,927,367 A | * | 5/1990 | Salvagno | ............. H05K 9/0039 |
| | | | | 439/97 |
| 6,262,887 B1 | * | 7/2001 | Lee | ........................ G06F 1/1616 |
| | | | | 361/752 |
| 8,598,466 B2 | | 12/2013 | Mantel et al. | |
| 9,232,630 B1 | * | 1/2016 | Jacobsson | ................ H05K 3/00 |

(Continued)

OTHER PUBLICATIONS

International Search Report and Written Opinion of International Application No. PCT/US2021/073116 dated Aug. 16, 2022, 11 pp.

(Continued)

*Primary Examiner* — Abhishek M Rathod
(74) *Attorney, Agent, or Firm* — Shumaker & Sieffert, P.A.

(57) ABSTRACT

An example device includes a circuit board: an electronic component that is attached to the circuit board and generates heat during operation; an enclosure, at least a portion of the enclosure being electrically conductive; a spacer positioned between the circuit board and the enclosure, the spacer comprising a first surface in contact with the circuit board and a second surface in contact with the electrically conductive portion of the enclosure, wherein the spacer is formed of a dielectric material and includes one or more electrically conductive pathways between the first surface and the second surface; and a fastener coupling the circuit board to the electrically conductive portion of the enclosure, the fastener passing through the spacer.

15 Claims, 4 Drawing Sheets

(56) References Cited

U.S. PATENT DOCUMENTS

| | | | |
|---|---|---|---|
| 10,797,394 B2 | 10/2020 | Dalmia et al. | |
| 10,903,560 B2 | 1/2021 | Loeher et al. | |
| 11,664,614 B2 * | 5/2023 | Tzeng | H05K 1/0215 |
| | | | 439/733.1 |
| 2005/0287838 A1 * | 12/2005 | Boudreau | H05K 7/142 |
| | | | 439/74 |
| 2006/0046532 A1 | 3/2006 | Hjort et al. | |
| 2007/0210602 A1 * | 9/2007 | Higgins | F16B 21/086 |
| | | | 24/297 |
| 2009/0034214 A1 * | 2/2009 | Kao | H05K 1/116 |
| | | | 29/829 |
| 2009/0219703 A1 * | 9/2009 | Ishii | H05K 1/0215 |
| | | | 174/262 |
| 2012/0119757 A1 | 5/2012 | Nakamura et al. | |
| 2014/0211432 A1 | 7/2014 | Lozano et al. | |
| 2015/0029687 A1 * | 1/2015 | Gillard | H05K 9/0007 |
| | | | 174/394 |
| 2019/0293695 A1 * | 9/2019 | Guthrie | H02M 3/156 |
| 2020/0015361 A1 | 1/2020 | Brodbeck et al. | |
| 2022/0201860 A1 * | 6/2022 | Kim | H05K 7/142 |

OTHER PUBLICATIONS

Sponagle et al., "Experimental Evaluation of a Latent Heat Storage Module with a Heat Spreader for Thermal Management of a Tablet Computer", Apr. 28, 2021, 20 pp.
Response to Communication Pursuant to Rules 161(1) and 162 EPC dated Apr. 30, 2024, from counterpart European Application No. 21847668.7, filed Aug. 21, 2024, 3 pp.

\* cited by examiner

THERMALLY INSULATING AND ELECTRICALLY CONDUCTIVE SPACER

BACKGROUND

A mobile computing device may include electronic components attached to a circuit board. During operation, the electronic components may generate heat. In general, it may be desirable for the mobile computing device to reject (e.g., dissipate) the beat evenly (e.g., so as to avoid creating uncomfortable hot spots on the enclosure and/or an exterior surface of the mobile computing device).

SUMMARY

In general, aspects of this disclosure are directed spacers that are a combination of thermally insulative and electrically conductive enclosure. A mobile computing device may include electronic components attached to a circuit board, an electrically conductive enclosure, and a fastener connecting the circuit board to the enclosure. A spacer may be included between the circuit board and the enclosure, and the fastener may pass through the spacer. During operation, the electronic components may generate beat and/or utilize an electrical connection with the enclosure (e.g., for ground) to which the circuit board is attached. Forming the spacer out of a thermally insulative material may provide good heat rejection characteristics but poor electrical conductivity characteristics. However, forming the spacer out of an electrically conductive material may provide good electrical conductivity characteristics but poor heat rejection characteristics.

In accordance with one or more aspects of this disclosure, a spacer of a mobile computing device may be formed of a dielectric material and include one or more electrically conductive pathways between a first surface (e.g., a top of the spacer) and a second surface (e.g., a bottom of the spacer). As one example, the spacer may include one or more vias that form electrically conductive pathways. As another example, the spacer may include a plated through hole (e.g., a plated center channel through which the fastener passes) that forms an electrically conductive pathway. By including one or more electrically conductive pathways in a spacer formed of a dielectric material, the spacer of this disclosure may provide both good heat rejection characteristics (i.e., may be a good thermal insulator) and good electrical conductivity characteristics. In this way, the heat generated by the electronic components may be more evenly rejected (e.g., hotspots may be reduced in intensity) while still preserving an electrical link with the enclosure.

In one example, a device includes a circuit board; an electronic component that is attached to the circuit board and generates heat during operation: an enclosure, at least a portion of the enclosure being electrically conductive: a spacer positioned between the circuit board and the enclosure, the spacer comprising a first surface in contact with the circuit board and a second surface in contact with the electrically conductive portion of the enclosure, wherein the spacer is formed of a dielectric material and includes one or more electrically conductive pathways between the first surface and the second surface; and a fastener coupling the circuit board to the electrically conductive portion of the enclosure, the fastener passing through the spacer.

The details of one or more examples are set forth in the accompanying drawings and the description below. Other features, objects, and advantages of the disclosure will be apparent from the description and drawings, and from the claims.

DETAILED DESCRIPTION

Figures 1A, 1B:
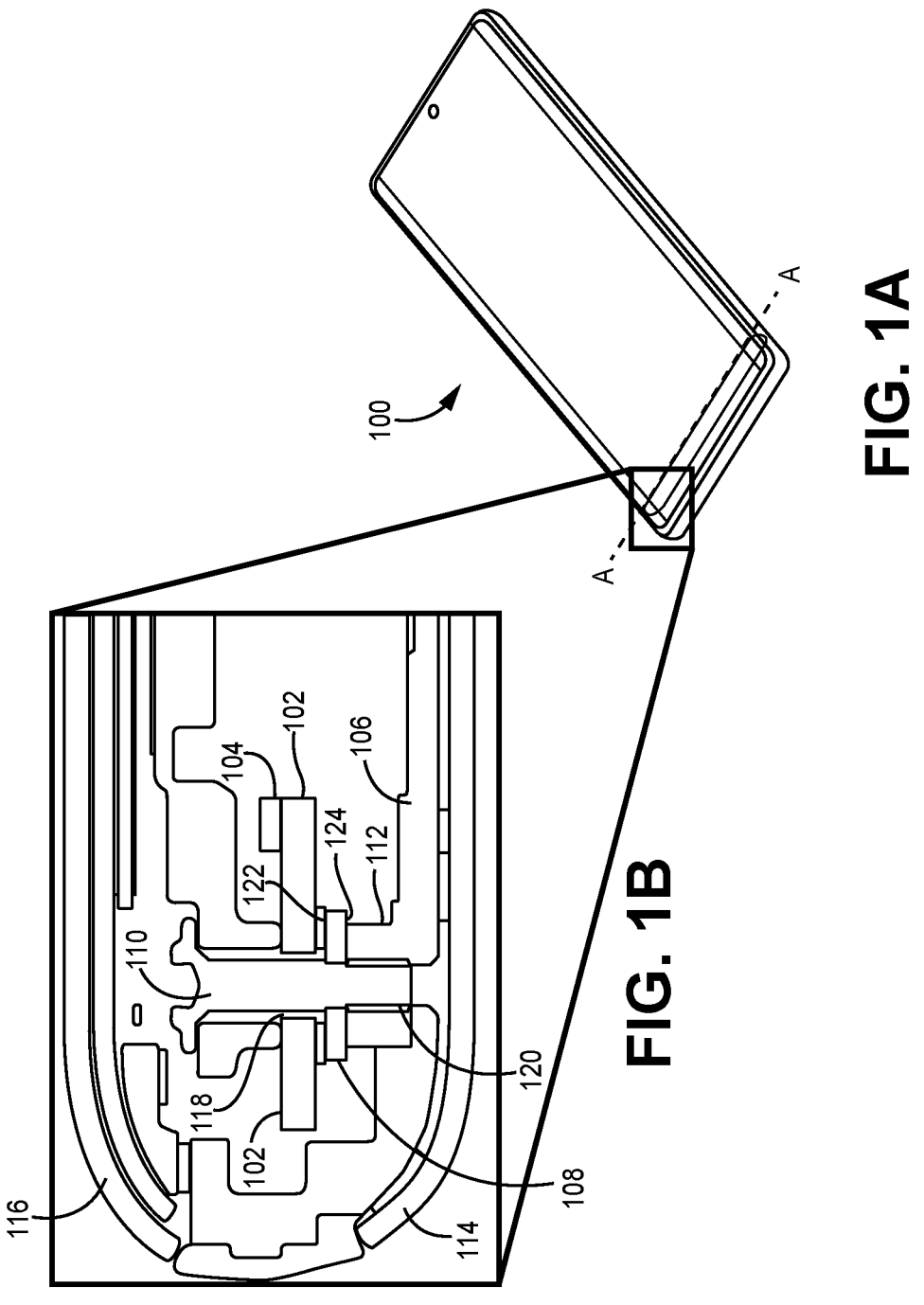
FIG. 1A is a schematic diagram illustrating an example mobile computing device in accordance with one or more aspects of this disclosure.
FIG. 1B is a schematic diagram illustrating a portion of a cross section of the mobile computing device 100 of FIG. 1A.

FIG. 1A is a schematic diagram illustrating an example mobile computing device 100 in accordance with one or more aspects of this disclosure. FIG. 1B is a schematic diagram illustrating a portion of a cross section of device 100 along line A-A. Examples of device 100 include mobile computing devices such as smart phones, wearable computing devices (e.g., smart watches, virtual reality (VR) headsets, mixed reality (MR) headsets, fitness trackers, etc.), laptops, tablets, e-readers, gaming systems, or any other portable device that includes electronic components. As shown in FIGS. 1A and 1B, device 100 may include circuit board 102, electronic component 104, electrically conductive enclosure 106, spacer 108, and fastener 110.

Circuit board 102 may physically carry and provide electrical interconnection for various electronic components, such as electronic component 104. Circuit board 102 may be a printed circuit board (PCB) configured to allow any combination of surface mount and through hole connection of electronic components. Circuit board 102 may be formed, at least in part, of a non-conductive (i.e., dielectric) substrate. Example substrates include, but are not limited to, FR-2. FR-4, ceramics, and the like. Circuit board 102 may be a single sided, double sided, or multi-layer circuit board. In some examples, circuit board 102 may be referred to as a main logic board (MLB), motherboard, or the like. However, aspects of this disclosure are applicable to any circuit board use case (e.g., power supply circuit boards, daughterboards, etc.). Further details of one example of circuit board 102 are discussed below with reference to FIG. 2.

Electronic component 104 may be an electrical component that performs one or more operations at device 100. Electronic component 104 may be attached (e.g., physically and electrically) to circuit board 102. Examples of electronic component 104 include, but are not limited to, circuit components (e.g., resistors, capacitors, inductors, transistors, etc.), a system on a chip (SoC) (e.g., a single component that includes one or more processors, memory, and/or other components); and a wireless communication modem (e.g., a cellular modem, a Wi-Fi modem, and/or a Bluetooth modem). Electronic component 104 may generate heat during operation. For instance, where electronic component 104 is a wireless communication modem, electronic component 104 may generate heat while wirelessly receiving and/or transmitting radio signals. While only one electronic component 104 is shown in FIGS. 1A and 1B, it is understood that a plurality of electronic components may be present and attached to circuit board 102.

Electrically conductive enclosure 106 may be a structural component that supports and connects one or more components of device 100. For instance, electrically conductive enclosure 106 may form a housing to which components of device 100 are attached Example components that may be attached to electrically conductive enclosure include, but are not necessarily limited to, circuit board 102, rear casing 114 (e.g., back glass), front casing 116 (e.g., front glass), antennas, wireless charging coils, displays, speakers, microphones, and other components. Electrically conductive enclosure 106 may be formed of an electrically conductive material, such as aluminum or steel.

Electrically conductive enclosure 106 may also provide some electrical interconnection between various components. For instance, electronic component 104 may utilize electrically conductive enclosure 106 as a ground. Electronic component 104 may electrically connect to electrically conductive enclosure 106 via an electrical path created by circuit board 102 and/or fastener 110. While stated as electrically conductive enclosure 106, it is understood that electrically conductive enclosure 106 may include one or more non-electrically conductive components/portions. As such, electrically conductive enclosure 106 may be an enclosure, at least a portion of-which is electrically conductive.

Circuit board 102 and electrically conductive enclosure 106 may each include features configured to aid in attachment of circuit board 102 to electrically conductive enclosure 106. For instance, circuit board 102 may define one or more holes through which fasteners connecting circuit board 102 to electrically conductive enclosure 106, such as fastener 110, may pass. Similarly, electrically conductive enclosure 106 may define features configured to receive the fasteners. As one specific example, where fastener 110 is a screw, circuit board 102 may define hole 118, electrically conductive enclosure 106 may define threaded channel 120, and fastener 110 may pass through hole 118 to be screwed into threaded channel 120.

In some examples, electrically conductive enclosure 106 may include one or more features configured to offset circuit board 102 from electrically conductive enclosure 106. For instance, electrically conductive enclosure 106 may include one or more bosses configured to offset circuit board 102 from electrically conductive enclosure 106. As shown in FIG. 1B, electrically conductive enclosure 106 may include boss 112, which may define threaded channel 120. In other examples, electrically conductive enclosure 106 may not include a boss at the location of fastener 110 (e.g., a hole may be drilled and tapped at such location).

Fastener 110 may be configured to attach circuit board 102 to electrically conductive enclosure 106. Examples of fastener 110 include, but are not limited to, screws, bolts, snaps, clips, pins, rivets, etc. In some examples, fastener 110 may be formed of an electrically conductive material. In some examples, fastener 110 may be formed of a dielectric (e.g., non-electrically conductive) material.

While illustrated as being attached at a single point, it some examples, circuit board 102 to electrically conductive enclosure 106 may be attached at multiple points. For instance, circuit board 102 may define a plurality of holes and device 100 may include a plurality of fasteners, each connecting circuit board 102 to electrically conductive enclosure 106 via a respective hole of the plurality of holes. Where device 100 includes a plurality of fasteners, the plurality of fasteners may or may not all be of the same material. For instance, a first subset of the plurality of fasteners may be formed of an electrically conductive material and a second subset of the plurality of fasteners may be formed of a dielectric material.

As discussed above, electronic component 104 may generate heat during operation. The generated heat may pass from electronic component 104 to circuit board 102, and then to electrically conductive enclosure 106. It may be desirable to avoid creating hot spots in electrically conducive enclosure 106. As one example it may be desirable to avoid creating and/or to reduce intensity of hotspots so as to avoid discomfort in a hand of a user holding device 100, such as where device 100 is configured to be held in the hand of the user. As another example it may be desirable to avoid creating and/or to reduce intensity of hotspots so as to avoid discomfort in on a skin of a user wearing device 100, such as where device 100 is a wearable computing device configured to be worn by the user. Increasing a thermal resistance between circuit board 102 and electrically conducive enclosure 106 may reduce an intensity of hot spots in electrically conductive enclosure. One way that the thermal resistance between circuit board 102 and electrically conducive enclosure 106 may be increased is to include spacer 108 between circuit board 102 and electrically conducive enclosure 106. However, when spacer 108 is formed of thermally insulative materials, such as dielectric materials, spacer 108 may exhibit poor electrical conductivity between circuit board 102 and electrically conducive enclosure 106. As such, including spacer 108 may undesirably interfere with an ability of components (e.g., electronic component 104) to use electrically conductive enclosure 106 for electrical purposes.

In accordance with one or more aspects of this disclosure, spacer 108 of device 100 may be formed of a dielectric material and include one or more electrically conductive pathways between first surface 122 (e.g., a top of spacer 108) and second surface 124 (e.g., a bottom of spacer 108). Examples of dielectric material from which spacer 108 is formed (in part) include, but are not necessarily limited to, a printed circuit board (PCB) substrate material such as FR4, halogen-free FR4, ceramic material, and the like.

Spacer 108 may be any suitable shape. As one example, spacer 108 may be an annular cylinder. As another example, spacer 108 may be a torus. As another example, spacer 108 may be a rectangular prism with a cylindrical center channel.

As shown in FIG. 1B, first surface 122 of spacer 108 may engage circuit board 102 and second surface 124 of spacer 108 may engage electrically conductive enclosure 106. The electrically conductive pathways of spacer 108 may for an electrical connection between first surface 122 and second surface 124, thereby forming an electrical connection between circuit board 102 and electrically conductive enclosure 106.

The electrically conductive pathways may be formed in any suitable manner. As one example, the spacer may include one or more vias that form electrically conductive pathways. Further details of an example of spacer 108 that includes one or more vias are discussed below with reference to FIGS. 3A-3C. As another example, the spacer may include a plated through hole (e.g., a plated center channel through which the fastener passes) that forms an electrically conductive pathway. Further details of an example of spacer

108 that includes a plated through hole are discussed below with reference to FIGS. 4A-4C. As another example, the spacer may include both one or more vias and a plated through hole.

By including one or more electrically conductive pathways in spacer 108 that is generally formed of a dielectric material, spacer 108 may provide both good heat rejection characteristics (i.e., may be a good thermal insulator) and good electrical conductivity characteristics. In this way, the heat generated by electronic component 104 may be more evenly rejected (e.g., hotspots may be reduced in intensity) while still preserving an electrical link between electronic component 104 and electrically conductive enclosure 106 (via circuit board 102 and spacer 108).

Figure 2:
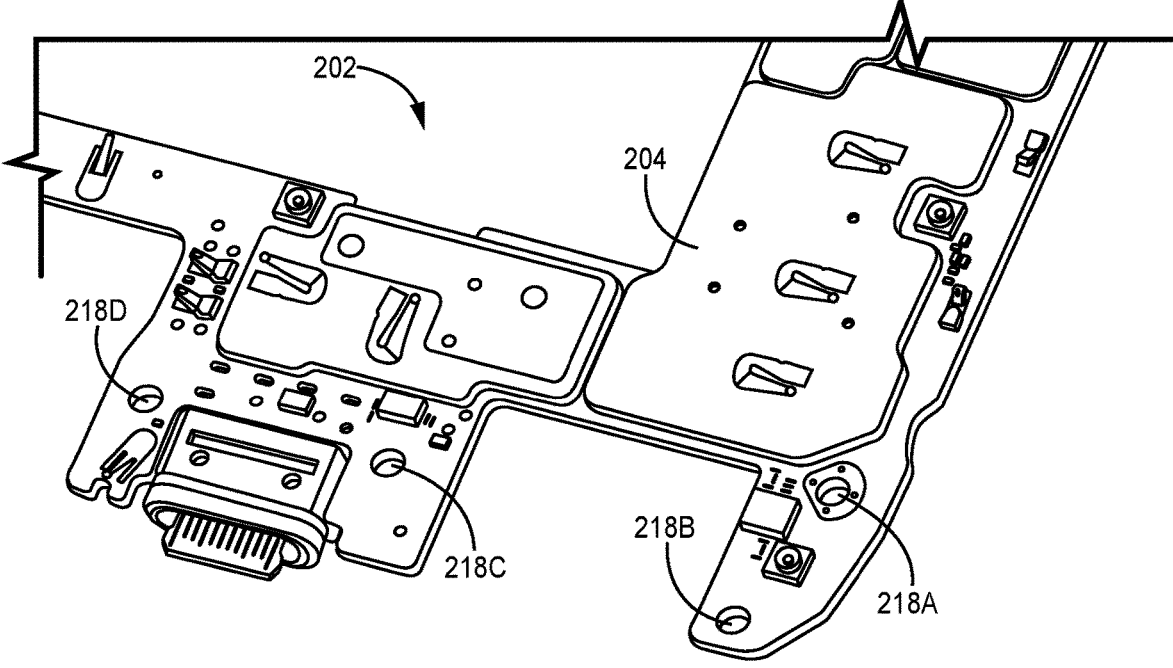
FIG. 2 is a schematic diagram illustrating an example circuit board attachable to an enclosure via a spacer than includes one or more conductive pathways, in accordance with one or more aspects of this disclosure.

FIG. 2 is a schematic diagram illustrating an example circuit board attachable to an enclosure via a spacer than includes one or more conductive pathways, in accordance with one or more aspects of this disclosure. Circuit board 202 of FIG. 2 may be an example of circuit board 102 of FIGS. 1A and 1B. Circuit board 202 may include electronic component 204, which may be an example of electronic component 104 of FIGS. 1A and 1B.

Circuit board 202 may define a plurality of holes 218A-218D (collectively, "holes 218") through which fasteners may pass to attach circuit board 202 to electrically conductive enclosure, such as electrically conductive enclosure 106 of FIGS. 1A and 1B. Hole 218A of holes 218 may be an example of hole 118 of FIGS. 1A and 1B. Circuit board 202 may include additional material (e.g., electrical pads) around one or more of holes 218 to facilitate electrical connection to the electrically conductive enclosure. For instance, as shown in FIG. 2, circuit board 202 may include electrical contacts around hole 218A.

A device that includes circuit board 202 may include spacers for all or a subset of holes 218. All or some of the spacers may include electrically conductive pathways. For instance, a spacer positioned between hole 218A (e.g., a hole proximal to electronic component 204) and the electrically conductive enclosure may include electrically conductive pathways. On the other hand, a spacer positioned between hole 218B (e.g., a hole distal to electronic component 204) and the electrically conductive enclosure may not include electrically conductive pathways. By including electrically conductive pathways in a subset of spacers, a cost of manufacturing the device may be reduced.

Figure 3A:
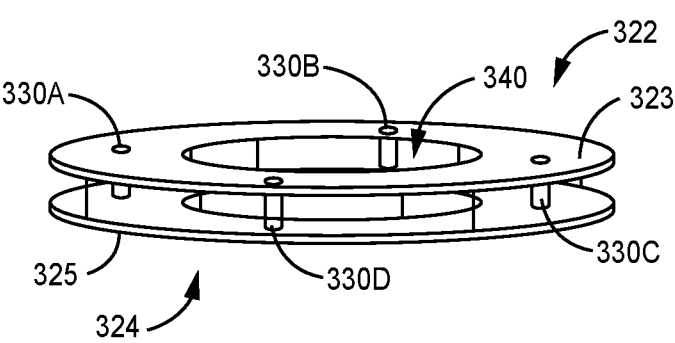
FIGS. 3A-3C are schematics illustrating an example spacer that includes electrically conductive pathways as vias, in accordance with one or more aspects of this disclosure.
Figure 3B:
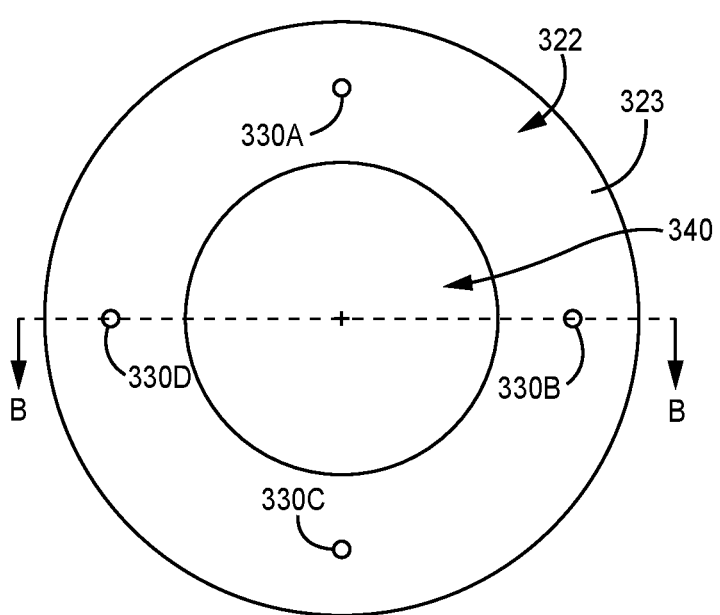
Figure 3C:
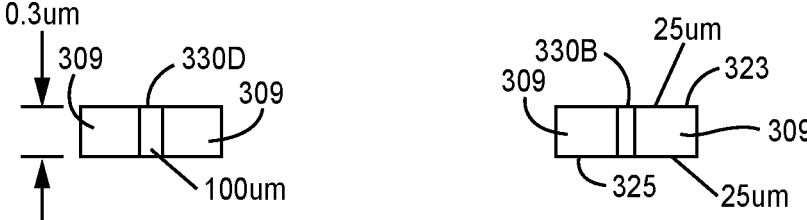

FIGS. 3A-3C are schematics illustrating an example spacer that includes electrically conductive pathways as vias, in accordance with one or more aspects of this disclosure. FIG. 3A is an isometric view of spacer 308. FIG. 3B is a top view of spacer 308, and FIG. 3C is a cross-section view of spacer 308 along line B-B. Spacer 308 may be an example of spacer 108 of FIGS. 1A and 1B. Similar to spacer 108 of FIGS. 1A and 1B, spacer 308 may be formed of a dielectric material and includes one or more electrically conductive pathways between first surface 322 and the surface 324. The portion of spacer 308 formed of the dielectric material is omitted from FIG. 3A (for clearer depiction of other components). Dielectric material 309 is shown in FIG. 3C. As shown in FIGS. 3A-3C, spacer 308 may include center channel 340. Center channel 340 may be configured (e.g., sized) to allow passage of a fastener (e.g., fastener 110 of FIGS. 1A and 1B).

As discussed above, in some examples, a spacer may include one or more electrically conductive pathways as vias. For instance, spacer 300 may include vias 330A-330D (collectively, "vias 330") that extend between first surface 322 and second surface 324. While illustrated in FIGS.

3A-3C as including 4 vias 330, the techniques of this disclosure are not so limited. In other examples, vias 330 may include 2, 3, 4, 5, 6, 7, 8, etc. vias.

Vias 330 may be formed using any suitable technique. As one example vias 330 may be formed by drilling a hole at each via location and plating the drilled holes with an electrically conductive material, such as copper. As shown in the example of FIG. 3C, a diameter of vias 330 may be approximately (e.g., within +/−5%) 100 μm (microns).

In some examples, surfaces of spacer 300 that are configured to engage with other components may include layers of electrically conductive materials. For instance, as shown in FIGS. 3A-3C, first surface 322 may include layer 323 and second surface 324 may include layer 325. Layers 323 and 325 may be formed of electrically conductive material. As shown in the example of FIG. 3C, a thickness of layers 323 and 325 may be approximately (e.g., within +/−5%) 25 μm (microns). As shown in FIG. 3C, dielectric material 309 may be disposed between layers 323 and 325 (e.g., and thus be disposed between first surface 322 and second surface 324). Layers 323 and 325 may be electrically connected to vias 330 (e.g., vias 330 along with layers 323 and 325 may be formed in a common plating process so as to form a continuous electric conductor). As such, layers 323 and 325 may improve an electrical connection formed between vias 330 and engaged components (e.g., circuit board 102 of FIGS. 1A and 1B, and electrically conductive enclosure 106 of FIGS. 1A and 1B).

Dimensions of spacer 308 may be selected based on application. For instance, in some examples, a thickness of spacer 308 may be greater than or equal to 0.2 mm. As shown in the example of FIGS. 3A-3C, the thickness of spacer 308 may be 0.3 mm. Various properties of spacer 308 may be adjusted to achieve desired thermal resistance and electrical conductivity. As one example, a thickness of dielectric material 309 may be increased to increase thermal resistance. As another example, a quantity and/or a plating thickness of vias 330 may be increased to increase electrical conductivity.

Figure 4A:
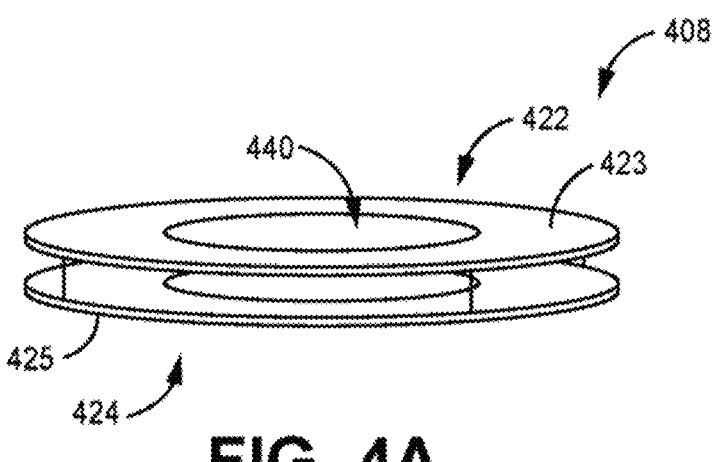
FIGS. 4A-4C are schematics illustrating an example spacer that includes an electrically conductive pathways as a plated center channel, in accordance with one or more aspects of this disclosure.
Figure 4B:
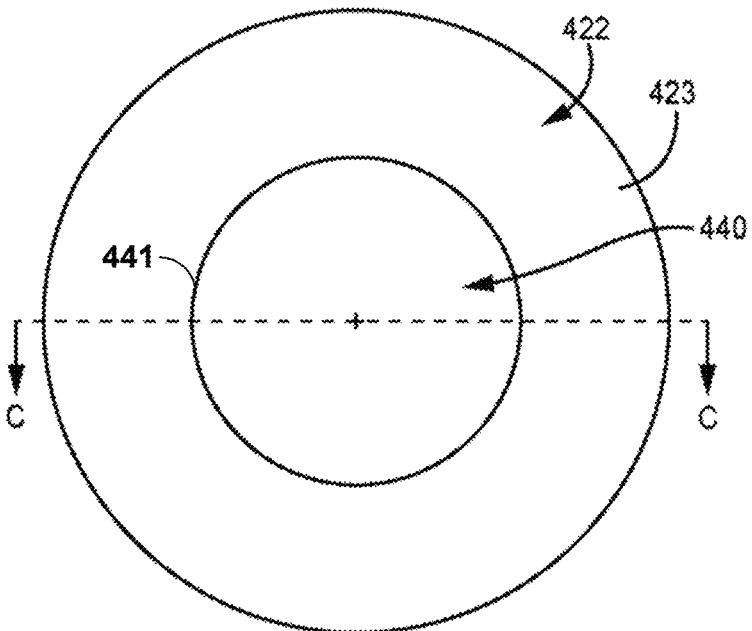
Figure 4C:
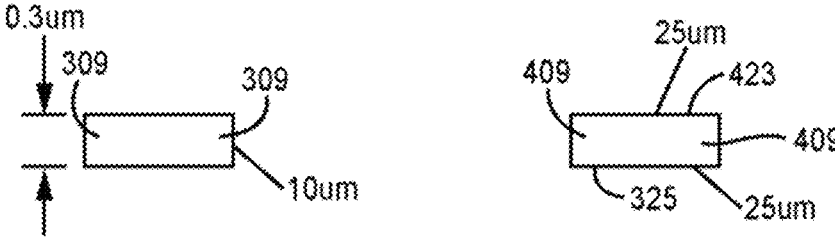

FIGS. 4A-4C are schematics illustrating an example spacer that includes an electrically conductive pathways as a plated center channel, in accordance with one or more aspects of this disclosure. FIG. 4A is an isometric view of spacer 408. FIG. 4B is a top view of spacer 408, and FIG. 4C is a cross-section view of spacer 408 along line C-C. Spacer 408 may be an example of spacer 108 of FIGS. 1A and 1B. Similar to spacer 108 of FIGS. 1A and 1B and spacer 308 of FIGS. 3A-3C, spacer 408 may be formed of a dielectric material and includes one or more electrically conductive pathways between first surface 422 and the surface 424. The portion of spacer 408 formed of the dielectric material is omitted from FIG. 4A (for clearer depiction of other components). Dielectric material 409 is shown in FIG. 4C. As shown in FIGS. 4A-4C, spacer 408 may include center channel 440. Center channel 440 may be configured (e.g., sized) to allow passage of a fastener (e.g., fastener 110 of FIGS. 1A and 1B).

As discussed above, in some examples, a spacer may include an electrically conductive pathway as a plated through hole. For instance, spacer 400 may include plated center channel 441 (e.g., a central channel) that extends between first surface 422 and second surface 424.

Plated center channel 441 may be formed using any suitable technique. As one example, plated center channel 441 may be formed by plating center channel 440 with an electrically conductive material, such as copper.

In some examples, surfaces of spacer 400 that are configured to engage with other components may include layers of electrically conductive materials. For instance, as shown in FIGS. 4A-4C, first surface 422 may include layer 423 and second surface 424 may include layer 425. Layers 423 and 425 may be formed of electrically conductive material. As shown in the example of FIG. 4C, a thickness of layers 423 and 425 may be approximately (e.g., within +/−5%) 25 μm (microns). As shown in FIG. 4C, dielectric material 409 may be disposed between layers 423 and 425 (e.g., and thus be disposed between first surface 422 and second surface 424). Layers 423 and 425 may be electrically connected to plated center channel 441 (e.g., plated center channel 441 along with layers 423 and 425 may be formed in a common plating process so as to form a continuous electric conductor). As such, layers 423 and 425 may improve an electrical connection formed between plated center channel 441 and engaged components (e.g., circuit board 102 of FIGS. 1A and 1B, and electrically conductive enclosure 106 of FIGS. 1A and 1B).

Dimensions of spacer 408 may be selected based on application. For instance, in some examples, a thickness of spacer 408 may be greater than or equal to 0.2 mm. As shown in the example of FIGS. 4A-4C, the thickness of spacer 408 may be 0.3 mm. Various properties of spacer 408 may be adjusted to achieve desired thermal resistance and electrical conductivity. As one example, a thickness of dielectric material 409 may be increased to increase thermal resistance. As another example, a plating thickness of plated center channel 441 may be increased to increase electrical conductivity.

The following numbered example may illustrate one or more aspects of this disclosure:

Example 1. A device comprising: a circuit board: an electronic component that is attached to the circuit board and generates heat during operation: an electrically conductive enclosure; a spacer positioned between the circuit board and the electrically conductive enclosure, wherein the spacer comprises a first surface in contact with the circuit board and a second surface in contact with the electrically conductive enclosure, wherein the spacer is formed of a dielectric material and includes one or more electrically conductive pathways between the first surface and the second surface; and a fastener connecting the circuit board to the electrically conductive enclosure at via a hole in the circuit board that is adjacent to the electronic component, wherein the fastener passes through the spacer.

Example 2. The device of example 1, wherein the dielectric material comprises a printed circuit board (PCB) substrate material.

Example 3. The device of example 1, wherein the dielectric material comprises a halogen-free FR4 material.

Example 4. The device of example 1, wherein the one or more electrically conductive pathways are formed of an electrically conductive material, wherein the first surface and the second surface include a layer formed of the electrically conductive material, and wherein the dielectric material is disposed between the first surface and the second surface.

Example 5. The device of example 1, wherein the one or more electrically conductive pathways comprise one or more vias connected to the first surface and the second surface.

Example 6. The device of example 5, wherein the one or more vias comprise four vias.

Example 7. The device of example 1, wherein the spacer comprises a central channel through which the fastener passes, and wherein the one or more electrically conductive pathways comprise a plating of the central channel.

Example 8. The device of example 1, wherein the electronic component comprises one or more of: a system on a chip (SoC); and a wireless communication modem.

Example 9. The device of example 1, wherein a thickness of the spacer is greater than or equal to 0.2 mm.

Example 10. The device of example 1, wherein the fastener is a screw, and wherein the electrically conductive enclosure comprises a boss that includes a threaded channel configured to receive the screw.

Example 11. The device of example 1, wherein the spacer is a first spacer of a plurality of spacers that each include a first surface in contact with the circuit board and a second surface in contact with the electrically conductive enclosure, and wherein at least a second spacer of the plurality of spacers does not include any electrically conductive pathways.

Example 12. The device of example 1, wherein the device is a mobile computing device configured to be held in a hand of a user.

Example 13. The device of example 1, wherein the device is a wearable computing device configured to be worn by a user.

Various aspects have been described in this disclosure. These and other aspects are within the scope of the following claims.

The invention claimed is:

1. A device comprising:
   a circuit board;
   an electronic component that is attached to the circuit board and generates heat during operation;
   an enclosure, at least a portion of the enclosure being electrically conductive;
   a spacer positioned between the circuit board and the enclosure, the spacer comprising a first surface in contact with the circuit board and a second surface in contact with the electrically conductive portion of the enclosure, wherein the spacer is formed of a dielectric material and includes one or more electrically conductive pathways between the first surface and the second surface, wherein the spacer comprises a central channel through which the fastener passes, and wherein the one or more electrically conductive pathways comprise a conductive plating of the central channel; and
   a fastener coupling the circuit board to the electrically conductive portion of the enclosure, the fastener passing through the spacer.

2. The device of claim 1, wherein the dielectric material comprises a printed circuit board (PCB) substrate material.

3. The device of claim 1, wherein the dielectric material comprises a halogen-free FR4 material.

4. The device of claim 1, wherein the one or more electrically conductive pathways are formed of an electrically conductive material, wherein the first surface and the second surface include a layer formed of the electrically conductive material, and wherein the dielectric material is disposed between the first surface and the second surface.

5. The device of claim 1, wherein the one or more electrically conductive pathways comprise one or more vias connected to the first surface and the second surface.

6. The device of claim 5, wherein the one or more vias comprise four vias.

7. The device of claim 1, wherein the electronic component comprises one or more of:
   a system on a chip (SoC); or
   a wireless communication modem.

8. The device of claim 1, wherein a thickness of the spacer is greater than or equal to 0.2 mm.

9. The device of claim 1, wherein the fastener is a screw, and wherein the electrically conductive portion of the enclosure comprises a boss that includes a threaded channel configured to receive the screw.

10. The device of claim 1, further comprising a second spacer in contact with the circuit board and the enclosure, wherein the second spacer does not include any electrically conductive pathways.

11. The device of claim 1, wherein the device is a mobile computing device configured to be held in a hand of a user.

12. The device of claim 1, wherein the device is a wearable computing device configured to be worn by a user.

13. The device of claim 1, wherein the enclosure is an external housing configured to be held in a hand of a user, wherein the spacer provides thermal insulation between the electronic component and the enclosure.

14. The device of claim 1, wherein the first surface and the second surface of the spacer are plated.

15. The device of claim 1, wherein the first surface, the second surface, and the central channel are all formed in a common plating process.

* * * * *